US012567856B2

(12) United States Patent
Hiramatsu et al.

(10) Patent No.: US 12,567,856 B2
(45) Date of Patent: Mar. 3, 2026

(54) SURFACE ACOUSTIC WAVE FILTERS WITH SUPPRESSED CAVITY BENDING

(71) Applicant: SKYWORKS SOLUTIONS, INC., Irvine, CA (US)

(72) Inventors: Yuya Hiramatsu, Neyagawa (JP); Hiroyuki Nakamura, Osaka-Fu (JP); Keiichi Maki, Suita (JP); Kyohei Kobayashi, Otsu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 241 days.

(21) Appl. No.: 18/131,916

(22) Filed: Apr. 7, 2023

(65) Prior Publication Data

US 2023/0336159 A1 Oct. 19, 2023

Related U.S. Application Data

(60) Provisional application No. 63/362,907, filed on Apr. 13, 2022.

(51) Int. Cl.
*H03H 9/64* (2006.01)
*H03H 3/08* (2006.01)

(52) U.S. Cl.
CPC ............ *H03H 9/6483* (2013.01); *H03H 3/08* (2013.01); *H03H 9/6489* (2013.01)

(58) Field of Classification Search
CPC ...... H03H 9/6483; H03H 3/08; H03H 9/6489; H03H 9/1071; H03H 9/02834; H03H 9/02897; H03H 9/25; H03H 9/02614; H03H 9/725; H03H 9/02905; H03H 9/02559; H03H 9/0576; H03H 9/02574; H03H 3/02; H03H 2003/023; H03H 9/14541
See application file for complete search history.

(56) References Cited

U.S. PATENT DOCUMENTS

| | | | |
|---|---|---|---|
| 11,165,406 B2 * | 11/2021 | Lin | H03H 9/02007 |
| 2013/0063226 A1 * | 3/2013 | Burak | H03H 9/587 |
| | | | 333/187 |
| 2018/0152169 A1 * | 5/2018 | Goto | H03H 9/02574 |
| 2020/0266796 A1 * | 8/2020 | Matsuda | H03H 9/725 |
| 2021/0159876 A1 * | 5/2021 | Maki | H03H 9/6443 |
| 2021/0399716 A1 * | 12/2021 | Yu | H03H 9/0514 |

* cited by examiner

*Primary Examiner* — John W Poos
(74) *Attorney, Agent, or Firm* — Lando & Anastasi, LLP

(57) ABSTRACT

A surface acoustic wave (SAW) filter package comprises a substrate, one or more trenches formed in the substrate, a SAW filter formed in each trench of the one or more trenches, and a cavity forming layer extending horizontally across the substrate and each trench.

18 Claims, 11 Drawing Sheets

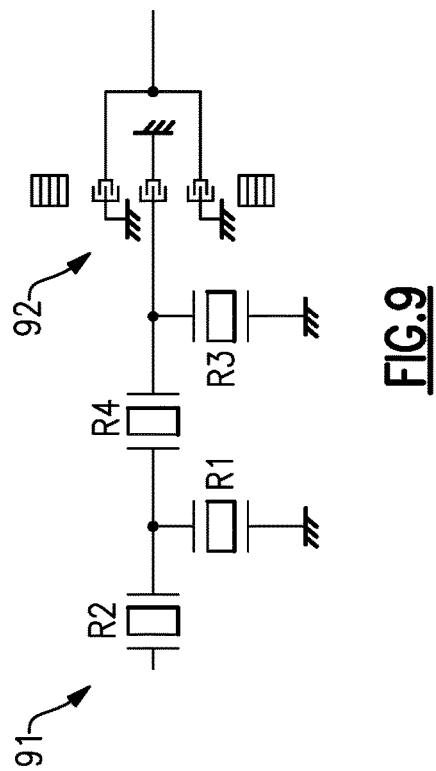
FIG.9
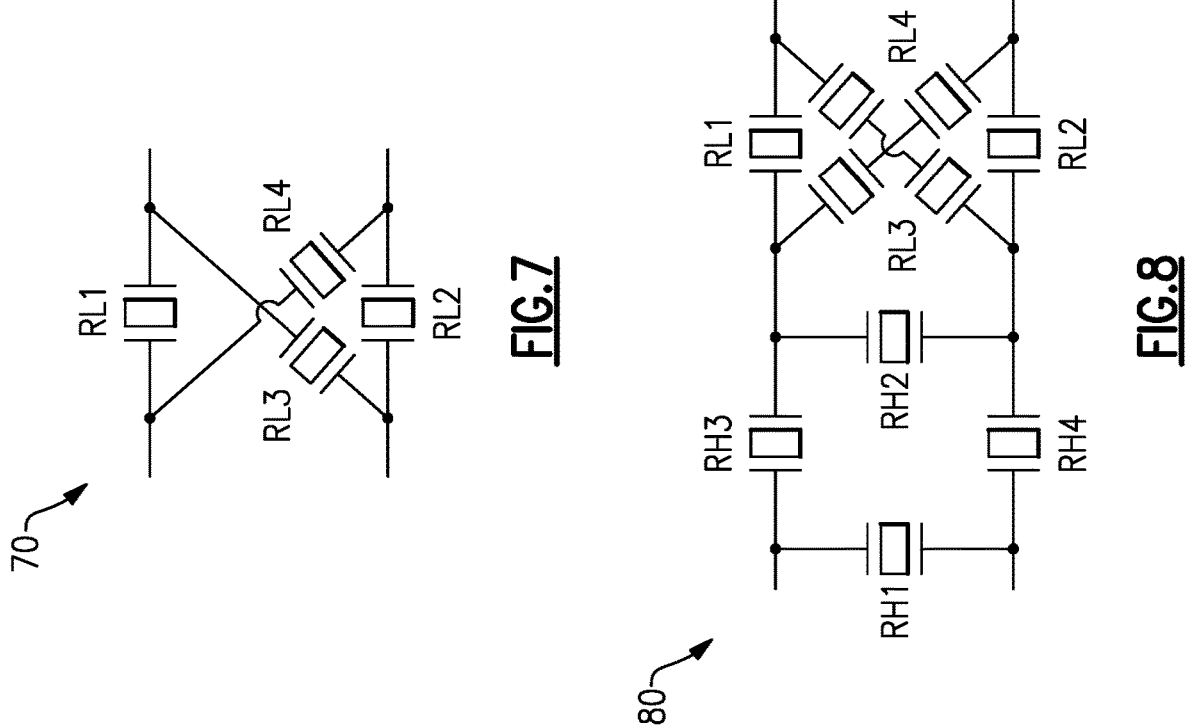
FIG.7
FIG.8

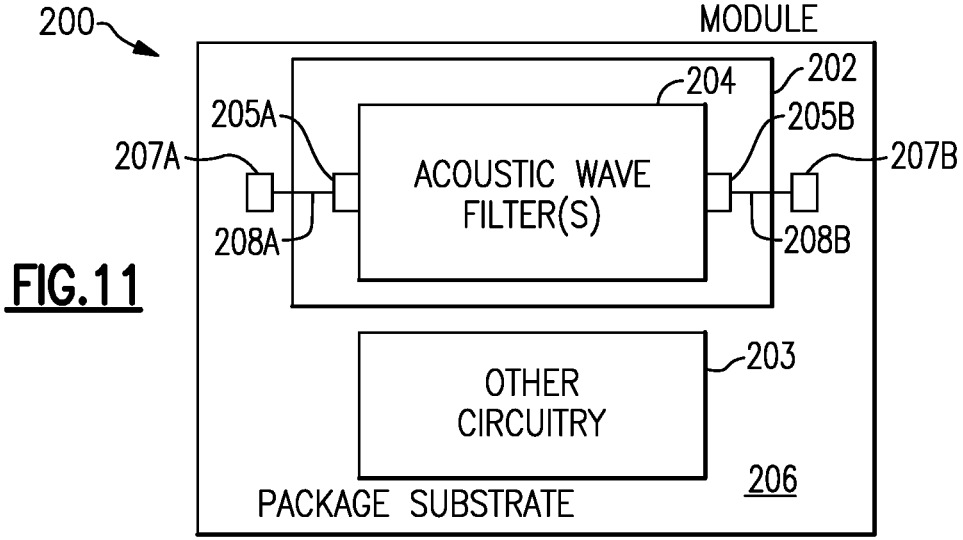
<u>FIG.11</u>
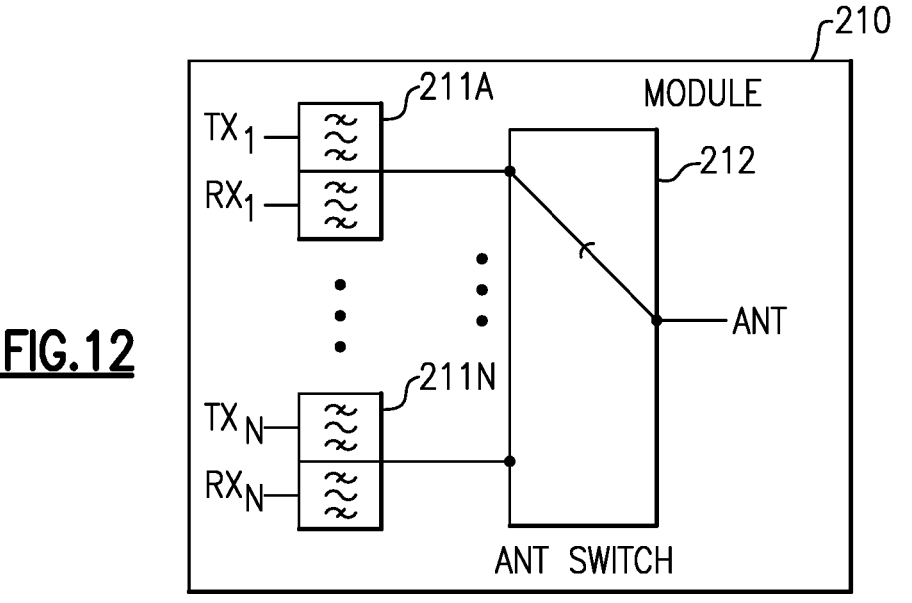
<u>FIG.12</u>

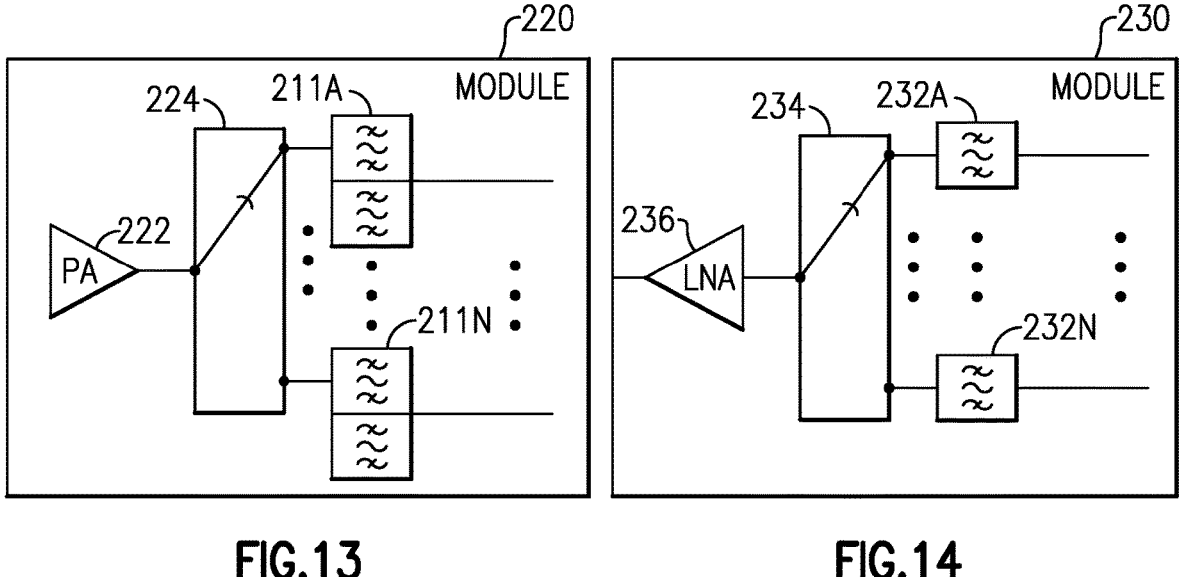
FIG.13
FIG.14
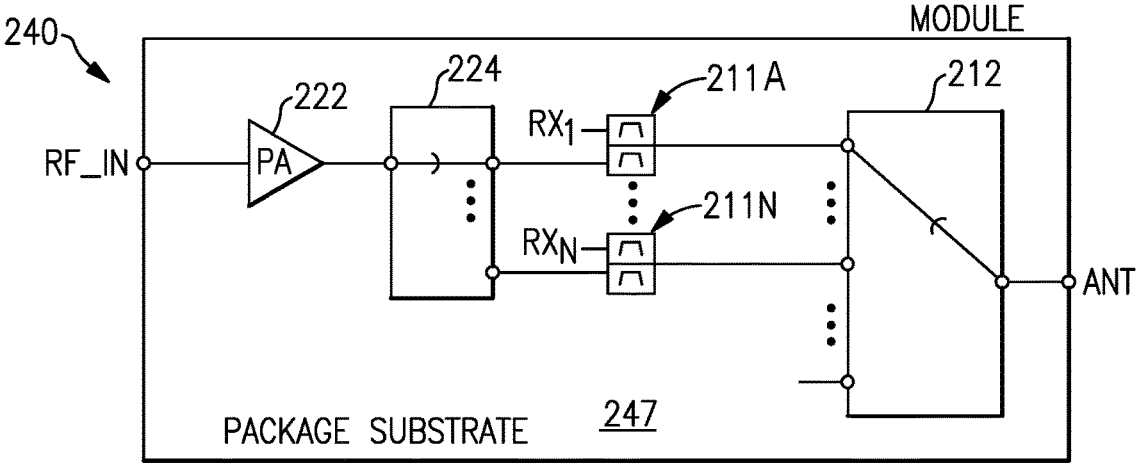
FIG.15

SURFACE ACOUSTIC WAVE FILTERS WITH SUPPRESSED CAVITY BENDING

CROSS-REFERENCE TO RELATED APPLICATIONS

This application claims priority under 35 U.S.C. § 119(e) to U.S. Provisional Patent Application Ser. No. 63/362,907, titled "SURFACE ACOUSTIC WAVE FILTERS WITH SUPPRESSED CAVITY BENDING," filed Apr. 13, 2022, the entire content of which is incorporated herein by reference in its entirety for all purposes.

BACKGROUND

Field

Embodiments of this disclosure relate to acoustic wave filters, and in particular surface acoustic wave filters with suppressed cavity bending.

Description of the Related Technology

An acoustic wave filter can include a plurality of resonators arranged to filter a radio frequency signal. Examples of acoustic wave resonators include surface acoustic wave (SAW) resonators and bulk acoustic wave (BAW) resonators. A surface acoustic wave resonator can include an interdigital transductor (IDT) electrode on a piezoelectric substrate. The surface acoustic wave resonator can generate a surface acoustic wave on a surface of the piezoelectric layer on which the interdigital transductor electrode is disposed. In BAW resonators, acoustic waves propagate in the bulk of a piezoelectric layer. Example BAW resonators include film bulk acoustic wave resonators (FBARs) and solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

Acoustic wave filters with low insertion loss are generally desirable. However, meeting insertion loss specifications for an entire passband of an acoustic wave filter can be challenging.

SUMMARY

In accordance with one aspect, there is provided a surface acoustic wave (SAW) filter package. The SAW package comprises a substrate, one or more trenches formed in the substrate, a SAW filter formed in each trench of the one or more trenches, and a cavity forming layer extending horizontally across the substrate and each trench.

In some embodiments, the SAW filter package further comprises a resin layer extending horizontally across the substrate and each trench of the one or more trenches.

In some embodiments, the resin layer extends directly above the cavity forming layer.

In some embodiments, the SAW filter comprises a temperature compensation layer.

In some embodiments, a trench of the one or more trenches has a width in the range of between 40 microns and 200 microns.

In some embodiments, a trench of the one or more trenches has a height in the range of between 3.5 microns and 5 microns or more.

In some embodiments, different trenches of the one or more trenches have different heights.

In accordance with another aspect, there is provided a method of forming a surface acoustic wave (SAW) filter package. The method comprises forming a substrate, forming one or more trenches in the substrate, forming a SAW filter in each trench of the one or more trenches, and forming a cavity forming layer extending horizontally across the substrate and each trench.

In some embodiments, the method further comprises forming a resin layer extending horizontally across the substrate and each trench of the one or more trenches.

In some embodiments, the resin layer is formed directly above the cavity forming layer.

In some embodiments, forming the filter in each trench of the one or more trenches comprises forming a temperature compensation layer.

In some embodiments, a trench of the one or more trenches has a width in the range of between 40 microns and 200 microns.

In some embodiments, a trench of the one or more trenches has a height in the range of between 3.5 microns and 5 microns or more.

In some embodiments, different trenches of the one or more trenches have different heights.

In accordance with another aspect, there is provided a surface acoustic wave (SAW) filter package. The SAW filter package comprises a substrate, one or more SAW filters formed on the substrate, and a cavity of $SiO_2$ formed above each of the one or more SAW filters.

In some embodiments, the SAW filter package further comprises a metal layer extending horizontally across the cavity of $SiO_2$ formed above each of the one or more SAW filters.

In some embodiments, the SAW filter package further comprises a resin layer extending horizontally across the metal layer.

In some embodiments, at least one filter of the one or more SAW filters comprises a temperature compensation layer.

In some embodiments, the cavity has a width in the range of between 40 microns and 200 microns.

In some embodiments, the cavity has a height in the range of between 3.5 microns and 5 microns or more.

In accordance with another aspect, there is provided a method of forming a surface acoustic wave (SAW) filter package. The method comprises forming a substrate, forming one or more SAW filters on the substrate, and forming a cavity of $SiO_2$ above each of the one or more filters.

In some embodiments, the method further comprises forming a metal layer extending horizontally across the cavity of SiO2 formed above each of the one or more SAW filters.

In some embodiments, the method further comprises forming a resin layer extending horizontally across the metal layer.

In some embodiments, forming the one or more SAW filters comprises forming a SAW filter having temperature compensation layer.

In some embodiments, the cavity has a width in the range of between 40 microns and 200 microns.

In some embodiments, the cavity has a height in the range of between 3.5 microns and 5 microns.

In accordance with another aspect, there is provided a multiplexer comprising a surface acoustic wave (SAW) filter package, the SAW filter package including a substrate, one or more trenches formed in the substrate, a SAW filter formed in each trench of the one or more trenches, and a cavity forming layer extending horizontally across the substrate and each trench.

In accordance with another aspect, there is provided a multiplexer comprising a surface acoustic wave (SAW) filter package, the SAW filter package including a substrate, one or more SAW filters formed on the substrate, and a cavity of $SiO_2$ formed above each of the one or more SAW filters.

In accordance with another aspect, there is provided a mobile device comprising a multiplexer including a surface acoustic wave (SAW) filter package, the SAW filter package including a substrate, one or more trenches formed in the substrate, a SAW filter formed in each trench of the one or more trenches, and a cavity forming layer extending horizontally across the substrate and each trench.

In accordance with another aspect, there is provided a mobile device comprising a multiplexer including a surface acoustic wave (SAW) filter package, the SAW filter package including a substrate, one or more SAW filters formed on the substrate, and a cavity of $SiO_2$ formed above each of the one or more SAW filters.

BRIEF DESCRIPTION OF THE DRAWINGS

Embodiments of this disclosure will now be described, by way of non-limiting example, with reference to the accompanying drawings.

FIG. 7 is a schematic diagram of a lattice filter;

FIG. 8 is a schematic diagram of a hybrid ladder and lattice filter;

FIG. 9 is a schematic diagram of an acoustic filter that includes ladder stages and a multi-mode surface acoustic wave filter;

FIG. 11 is a schematic diagram of a radio frequency module that includes an acoustic wave filter according to an embodiment;

FIG. 12 is a schematic block diagram of a module that includes an antenna switch and duplexers according to an embodiment;

FIG. 13 is a schematic block diagram of a module that includes a power amplifier, a radio frequency switch, and duplexers according to an embodiment;

FIG. 14 is a schematic block diagram of a module that includes a low noise amplifier, a radio frequency switch, and filters according to an embodiment;

FIG. 15 is a schematic diagram of a radio frequency module that includes an acoustic wave filter according to an embodiment;

DETAILED DESCRIPTION

Figure 1A:
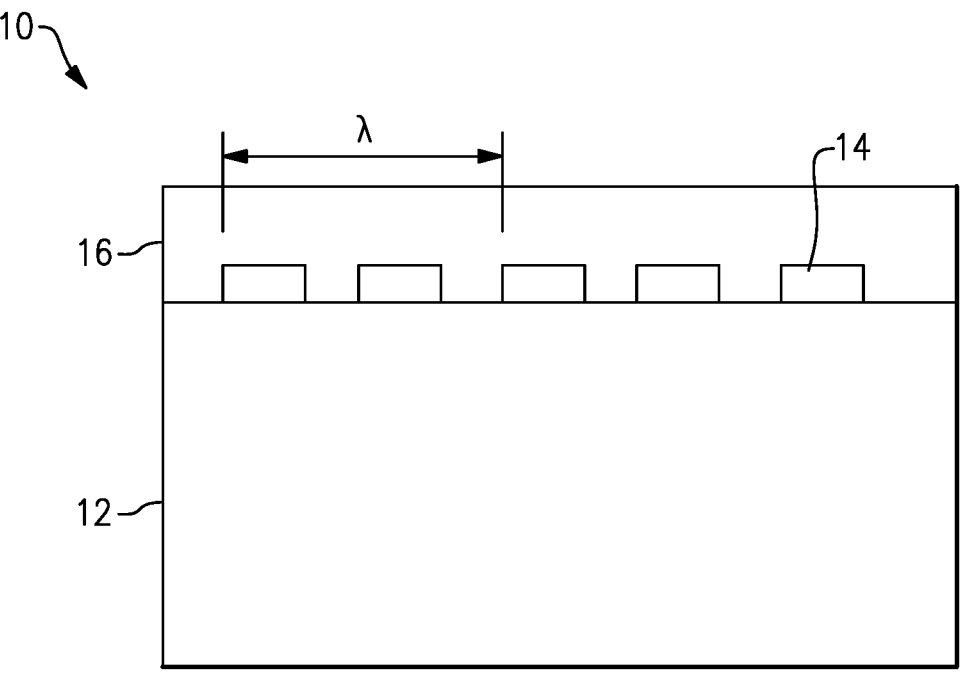
FIG. 1A is a cross-sectional view of a temperature compensated surface acoustic wave (TCSAW) device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic filters can implement band pass filters. For example, a band pass filter can be formed from temperature compensated surface acoustic wave (TCSAW) resonators. As another example, a band pass filter can be formed from bulk acoustic wave (BAW) resonators, such as film bulk acoustic wave resonators (FBARs).

In acoustic filters, insertion loss improvement is typically desired by customers. Insertion loss improvement can help a receive chain achieve a desired noise figure. Insertion loss improvement can help with implementing a transmit chain with less power consumption and/or better power handling.

Aspects of this disclosure relate to implementing an acoustic wave filter from more than one type of acoustic resonator. In certain embodiments, an acoustic wave filter can include series TCSAW resonators and shunt BAW resonators. Series TCSAW resonators can achieve higher quality factor (Q) in a frequency range below a resonant frequency (fs) of the filter, while shunt BAW resonators can achieve a higher Q in a frequency range between fs and an anti-resonant frequency (fp) of the filter.

Compared to a BAW-only acoustic wave filter, an acoustic wave filter with series TCSAW resonators and shunt BAW resonators can achieve better low channel insertion loss. Compared to a TCSAW-only acoustic wave filter, an acoustic wave filter with series TCSAW resonators and shunt BAW resonators can achieve better overall insertion loss. Accordingly, an acoustic wave filter with series TCSAW resonators and shunt BAW resonators can achieve desirable insertion loss. Goto, R., Nakamura, H., and Hashimoto, K., J. Appl. Phys. 58, SGGC07, 2019, disclose the modeling of a transverse mode in temperature compensated surface acoustic waves (TCSAW) using a $SiO_2/LiNbO_3$ structure to meet insertion loss specifications using TCSAW devices employing a $SiO_2$-overlay/$LiNbO_3$ substrate structure.

In a TCSAW package employing a cavity, the cavity may be deflected under the weight of a Cu plate and the like disposed thereon. A characteristic of a filter may deteriorate, especially when the filter experiences some abutment due to a deflection. Several columns have been provided not only around the periphery of the cavity but also in the cavity; however, there has been some instability, in particular due heat or stress during production.

Providing a cavity per resonator will reduce the space formed over the IDTs to alleviate the characteristic deterioration due to the deflection. As a method of forming the cavity per resonator, a groove is formed on the substrate, an IDT is formed in the groove, and each resonator is surrounded by $SiO_2$.

Example TCSAW devices will now be discussed.

FIG. 1A is a cross-sectional view of a TCSAW device 10. The TCSAW device 10 can be a TCSAW resonator. As illustrated, the TCSAW device 10 includes a piezoelectric layer 12, an interdigital transducer (IDT) electrode 14, and a temperature compensation layer 16 over the IDT electrode 14.

The piezoelectric layer 12 can be a lithium based piezoelectric layer. For example, the piezoelectric layer 12 can be a lithium niobate layer. As another example, the piezoelectric layer 12 can be a lithium tantalate layer.

In the TCSAW device 10, the IDT electrode 14 is over the piezoelectric layer 12. As illustrated, the IDT electrode 14 has a first side in physical contact with the piezoelectric layer 12 and a second side in physical contact with the temperature compensation layer 16. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some embodiments.

In the TCSAW device 10, the temperature compensation layer 16 can bring a temperature coefficient of frequency (TCF) of the TCSAW device 10 closer to zero. The temperature compensation layer 16 can have a positive TCF. This can compensate for a negative TCF of the piezoelectric layer 12. The piezoelectric layer 12 can be lithium niobate or lithium tantalate, which both have a negative TCF. The temperature compensation layer 16 can be a dielectric film. The temperature compensation layer 16 can be a silicon dioxide layer. In some other embodiments, a different temperature compensation layer 16 can be implemented. Some examples of other temperature compensation layers include a tellurium dioxide ($TeO_2$) layer or a silicon oxyfluoride (SiOF) layer.

Figure 1B:
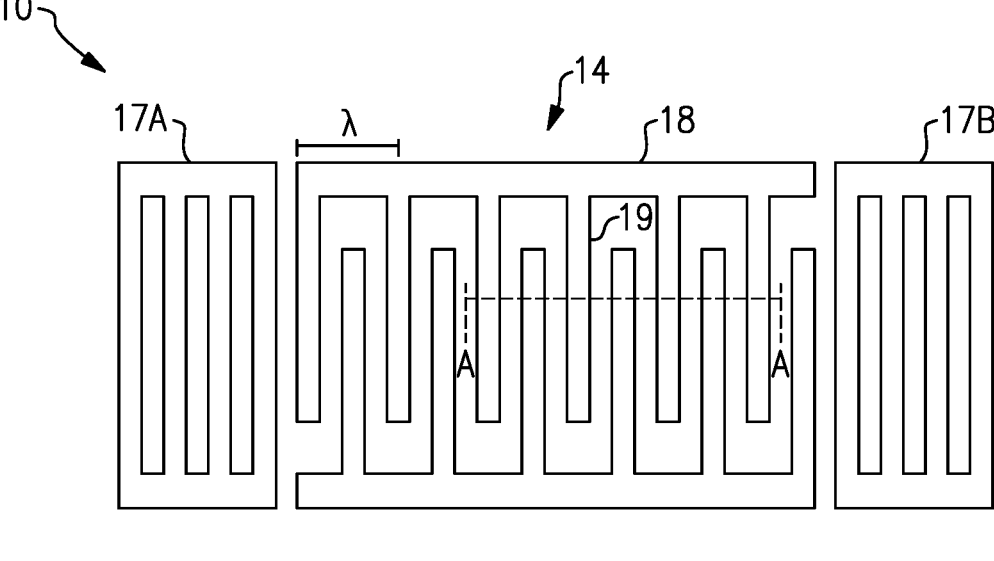
FIG. 1B is a top view of the TCSAW device of FIG. 1A.

FIG. 1B illustrates the IDT electrode 14 of the TCSAW device 10 of FIG. 1A in plan view. The view of the TCSAW device 10 in FIG. 1A is along the dashed line from A to A in FIG. 1B. The temperature compensation layer 16 is not shown in FIG. 1B to focus on the IDT electrode 14. The IDT electrode 14 is positioned between a first acoustic reflector 17A and a second acoustic reflector 17B. The acoustic reflectors 17A and 17B are separated from the IDT electrode 14 by respective gaps. The IDT electrode 14 includes a bus bar 18 and IDT fingers 19 extending from the bus bar 18. The IDT fingers 19 have a pitch of $\lambda$. The TCSAW device 10 can include any suitable number of IDT fingers 19. The pitch $\lambda$ of the IDT fingers 19 defines a resonant frequency of the TCSAW device 10.

Figure 2:
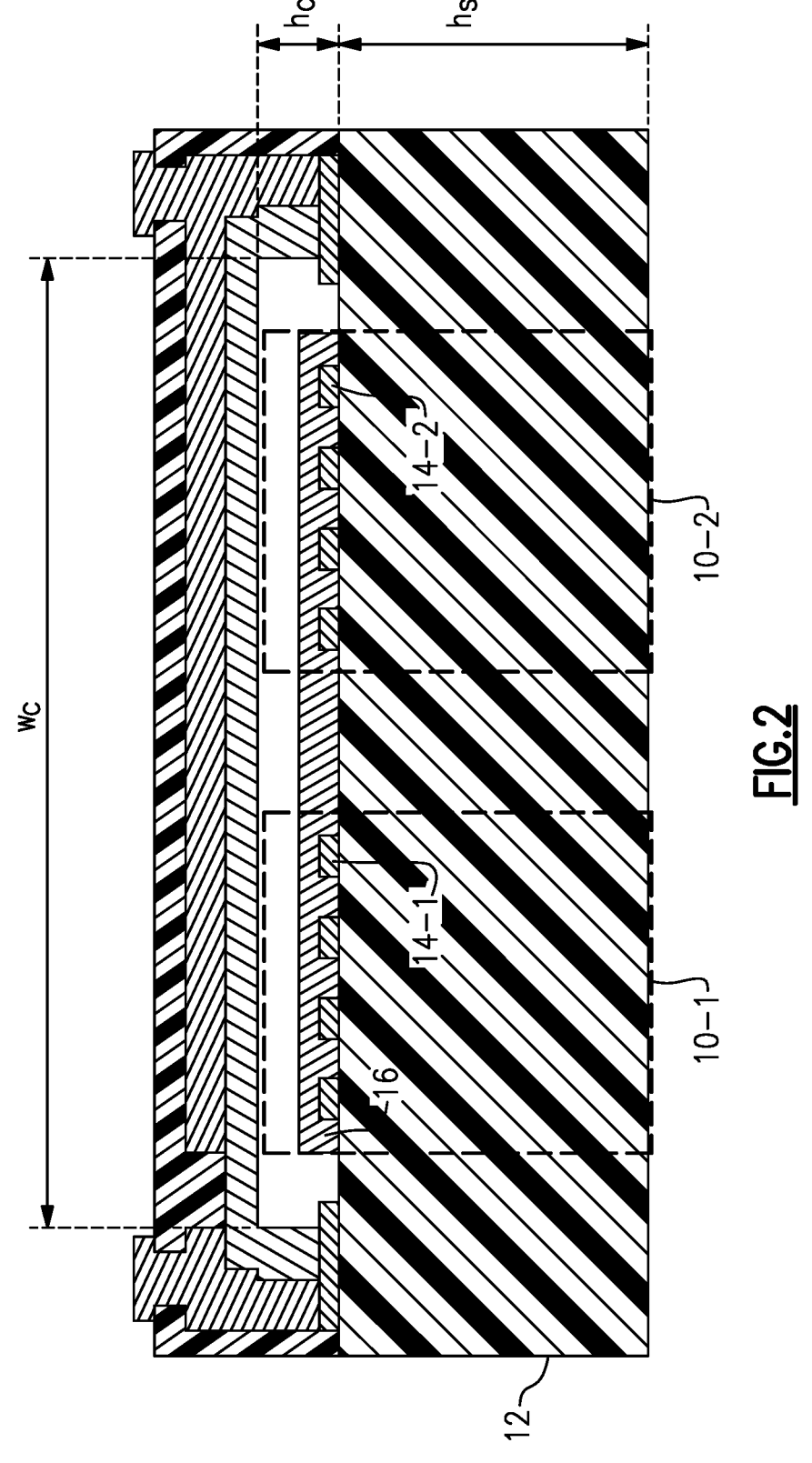
FIG. 2 is a cross-sectional view of a design of a package of TCSAW devices that may be weak and/or difficult to produce at high Q-factors.

FIG. 2 is a cross-sectional view of a design of a package of TCSAW devices that may be weak and/or difficult to produce at low defect rates and/or with high Q-factors.

The package comprises a plurality of filters 10-1 and 10-2 such as, for example, the TCSAW device of FIG. 1A. Electrodes 14-1 and 14-2 of each filter are formed on the substrate 12 and may be covered by a temperature compensation layer 16. The electrodes 14-1 and 14-2 and the temperature compensation layer 16 are arranged in a cavity formed by a cavity forming material such as polyimide. The substrate has a height $h_s$. Advantageous height $h_s$ is in the range between 100 and 150 um, preferably 130 um. The cavity has a height $h_c$. Advantageous heights $h_c$ are in the range between 10 and 15 um, preferably 12 um. The cavity has a width $w_c$. Advantageous widths $w_c$ are in the range between 500 and 2000 um.

The height of the temperature compensation layer 16 is in the range between 500 nm and 1700 nm. The height of the temperature compensation layer is approximately half of the height $h_c$ of the cavity. A ratio $w_c$ to $h_c$ is approximately 50.

The cavity forming layer above the temperature compensation layer 16 has a height of 10 um or higher.

The cavity forming layer is covered by a metal layer, for example, copper (Cu). The metal layer may consist of Cu only. The metal layer may have a height of around 50 um.

The metal layer is covered by a resin layer. Typical resins are polyimide, especially photosensitive insulating materials. The resin layer may have a height of around 60 um.

Figure 3:
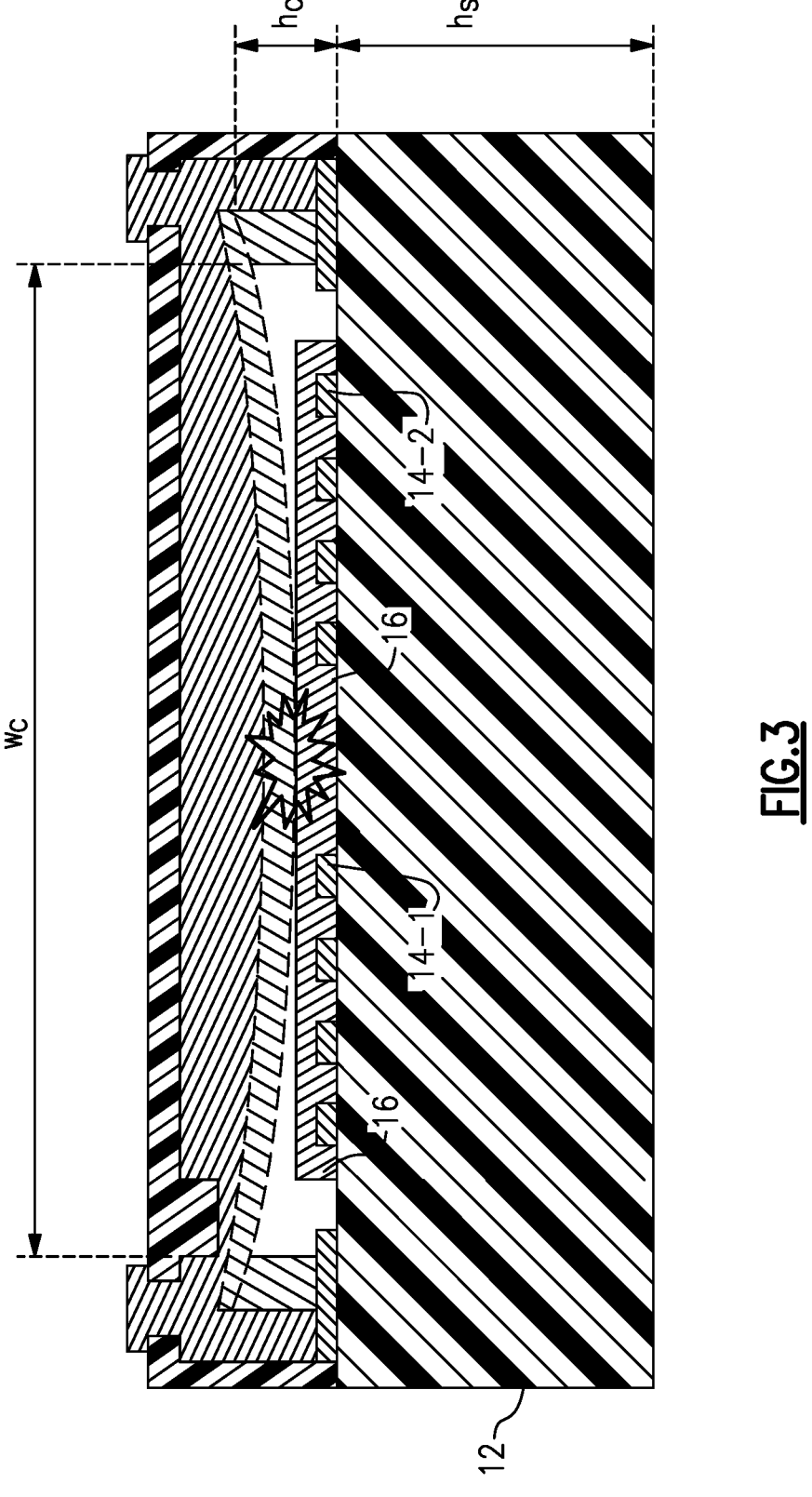
FIG. 3 is a cross-sectional view of the package of TCSAW devices according to the design of FIG. 2 exhibiting deficiencies due to e.g., heat or stress during production.

FIG. 3 is a cross-sectional view of the package of TCSAW devices according to the design of FIG. 2 exhibiting deficiencies due to e.g., heat or stress during production. As can be seen in FIG. 3, the cavity forming layer is bent during production and the metal layer is formed in a non-uniform manner across the bent cavity forming layer. The bent cavity forming layer may thus hits the filters, whereby a characteristic of the filters may deteriorate.

Figure 4A:
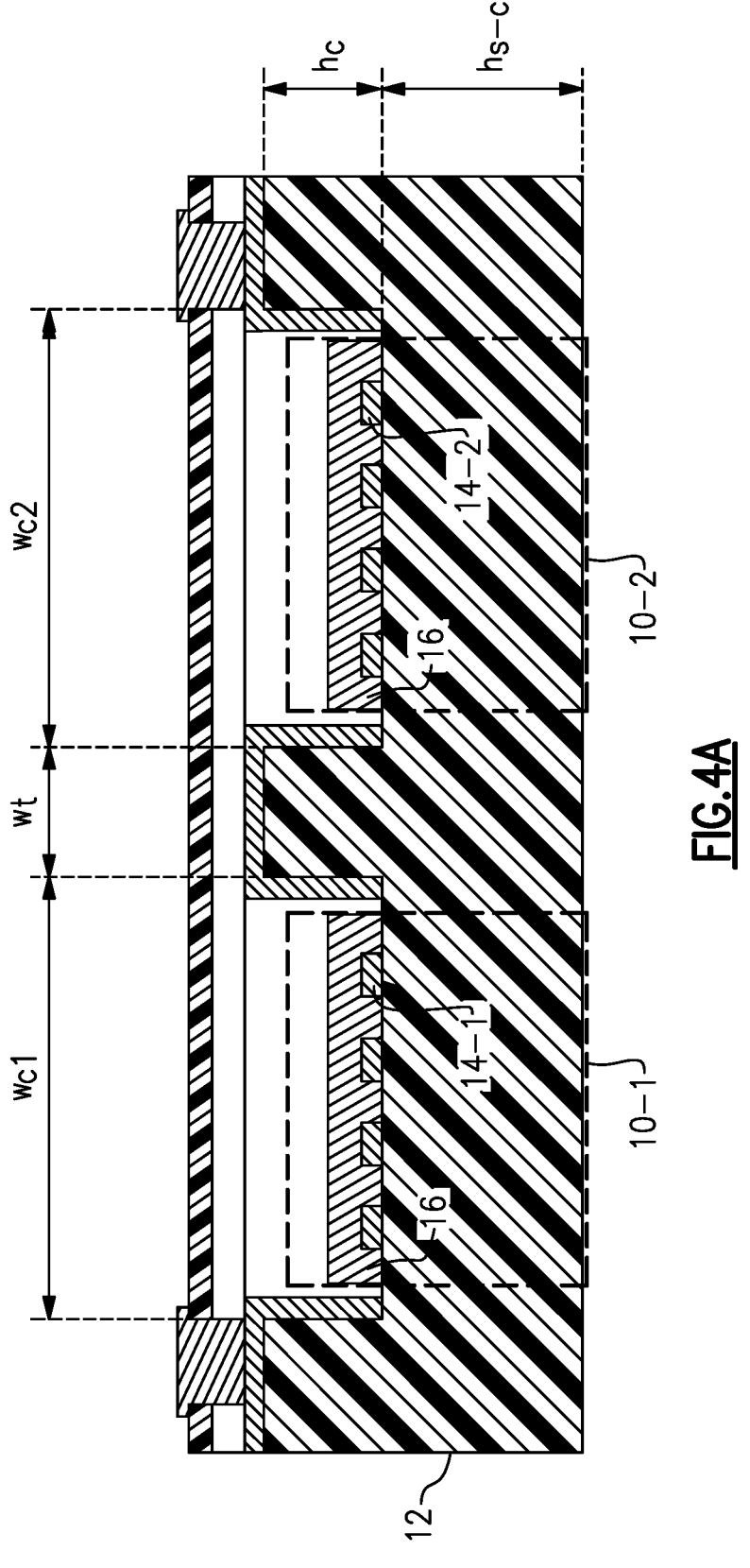
FIG. 4A is a cross-sectional view of a design of a package of TCSAW devices in which each filter has a cavity formed by a cavity forming material and each filter is formed in a trench in the piezoelectric substrate.

FIG. 4A is a cross-sectional view of a design of a package including TCSAW devices in which each filter has a cavity formed by a cavity forming material and each filter is formed in a trench in the piezoelectric substrate according to some embodiments.

The package of FIG. 4A comprises a substrate 12, for example, the substrate described in relation to FIG. 1A. The substrate 12 may have the height $h_{s-c}$. A plurality of trenches are formed in the substrate. A trench has a height $h_c$. Different trenches may have different heights. A filter 10-1, 10-2 is formed in each trench. Electrodes 14-1 and 14-2 of each filter 10-1, 10-2 are formed in the trench on the substrate 12 and covered by temperature compensation layer 16. Advantageous heights $h_{s-c}$ of the substrate 12 are around 130 um. Advantageous heights $h_c$ of the trenches have the height of the temperature compensation layer 16 plus approximately 3 um or more, i.e., around 5 $\mu$m or more. The trenches have widths $w_{c1}$ and $w_{c2}$. Advantageous widths $w_{c1}$ and $w_{c2}$ are in the range between 40 um and 200 um. The widths $w_{c1}$ and $w_{c2}$ may be different or may be the same. Adjacent trenches may be separated from each other by a width $w_t$. Different trenches may be separated by different widths $w_t$, such as 14 um or more.

A ratio $w_{c1}$ to $h_c$ or a ratio $w_{c2}$ to $h_c$ is approximately greater than 20. A ratio $w_t$ to $h_c$ is approximately 2 or more.

A cavity forming layer extends essentially horizontal and/or parallel to the surface of the substrate 12, thereby forming a cavity for each filter. The cavity forming layer may be formed from polyimide. The cavity forming layer may have a height of around 12 um, or a height in the range between 10 um and 15 um. The cavity forming layer may be formed from a plurality of layers formed from the same or different materials.

The cavity forming layer may be covered by a resin layer. Typical resins are polyimide, especially photosensitive insulating materials. The resin layer has a height of around 10 um. The resin layer may be formed from a plurality of layers formed from the same or different materials.

The package of TCSAW devices of FIG. 4A may be more stable under e.g., heat or stress during production than the package of FIGS. 2 and 3. The cavity forming layer is mechanically less prone to bending during production and is formed more uniformly when compared to conventional designs. Thus, the cavity forming layer is less likely to hit the shielded filters so that performance and advantageous characteristics of the filters may be preserved.

Figure 4B:
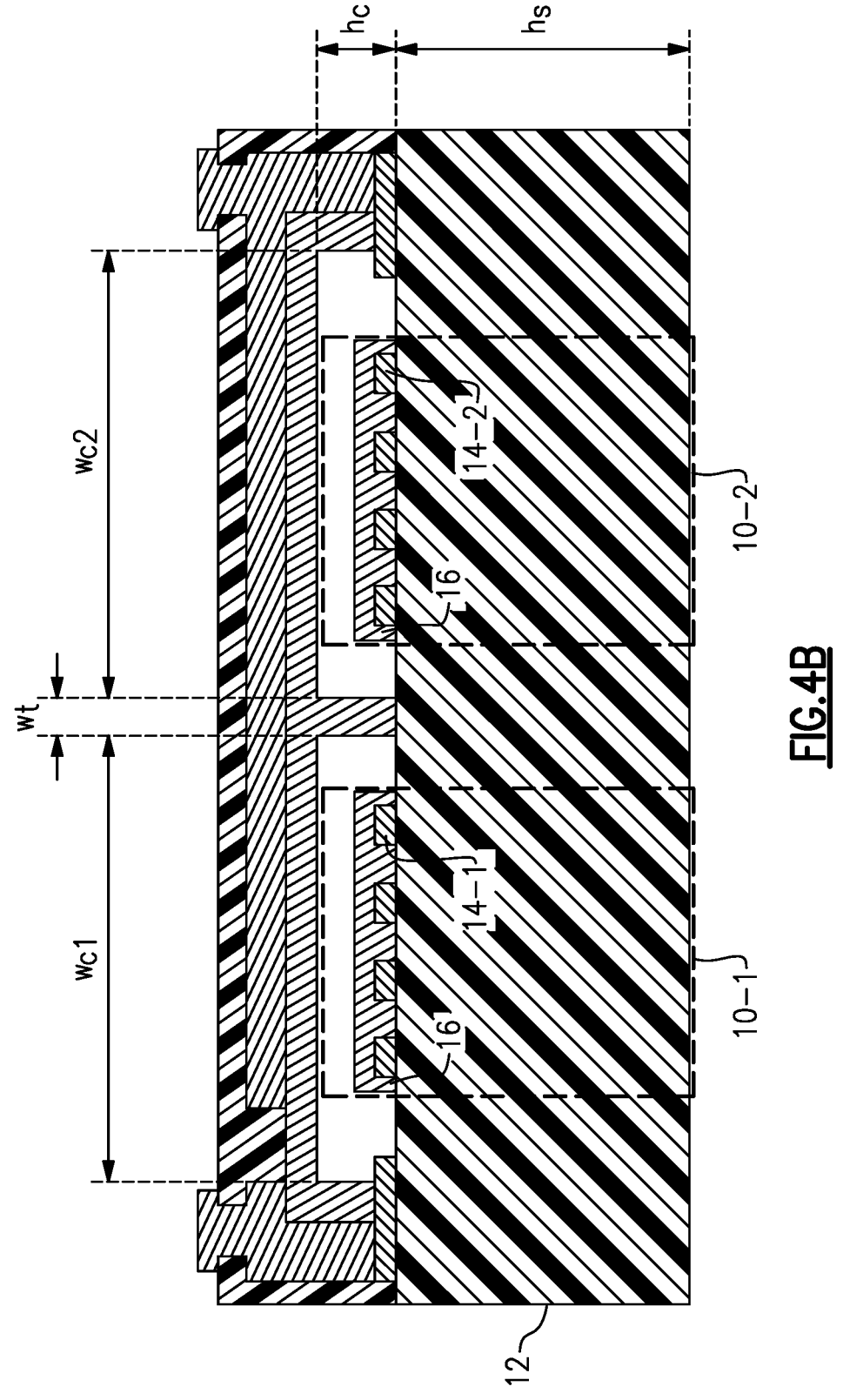
FIG. 4B is a cross-sectional view of a design of a package of TCSAW devices in which each filter is surrounded with $SiO_2$ instead of cavity forming material.

FIG. 4B is a cross-sectional view of a design of a package of TCSAW devices in which each filter is surrounded with $SiO_2$ instead of cavity forming material according to some embodiments.

The package of FIG. 4B comprises a substrate 12, for example, the substrate described in relation to FIG. 1A. The substrate 12 may have the height $h_s$. A filter 10-1, 10-2 is formed on the substrate. The filter comprises electrodes 14-1, 14-2 formed on the substrate 12 and covered by temperature compensation layer 16. Each filter 10-1, 10-2 is surrounded with $SiO_2$ forming a cavity for the respective filter 10-1, 10-2. The cavities have widths $w_{c1}$ and $w_{c2}$. Advantageous widths $w_{c1}$ and $w_{c2}$ are in the range between 40 um and 200 um. The widths $w_{c1}$ and $w_{c2}$ may be different or may be the same. Adjacent cavities may be separated from each other by a width $w_r$. Different cavities may be separated by different widths $w_r$.

The cavities of $SiO_2$ are covered by a metal layer, for example, copper (Cu). The metal layer may consist of a copper layer only. The metal layer may have a height of around 25 um or a height in the range between 20 um and 30 um.

The metal layer is covered by a resin layer. Typical resins are polyimide, especially photosensitive insulating materials. The resin layer has a height of around 10 um.

The package of TCSAW devices of FIG. 4B may be more stable under e.g., heat or stress during production than the package of FIGS. 2 and 3. The cavities shielded by the metal layer are mechanically less prone to bending during production and are formed more uniformly when compared to conventional designs. Thus, the metal layer shielding the cavities is less likely to hit the shielded filters so that performance and advantageous characteristics of the filters may be preserved.

A skilled person will understand that the examples of FIG. 4A and FIG. 4B may be combined.

Figures 5, 6:
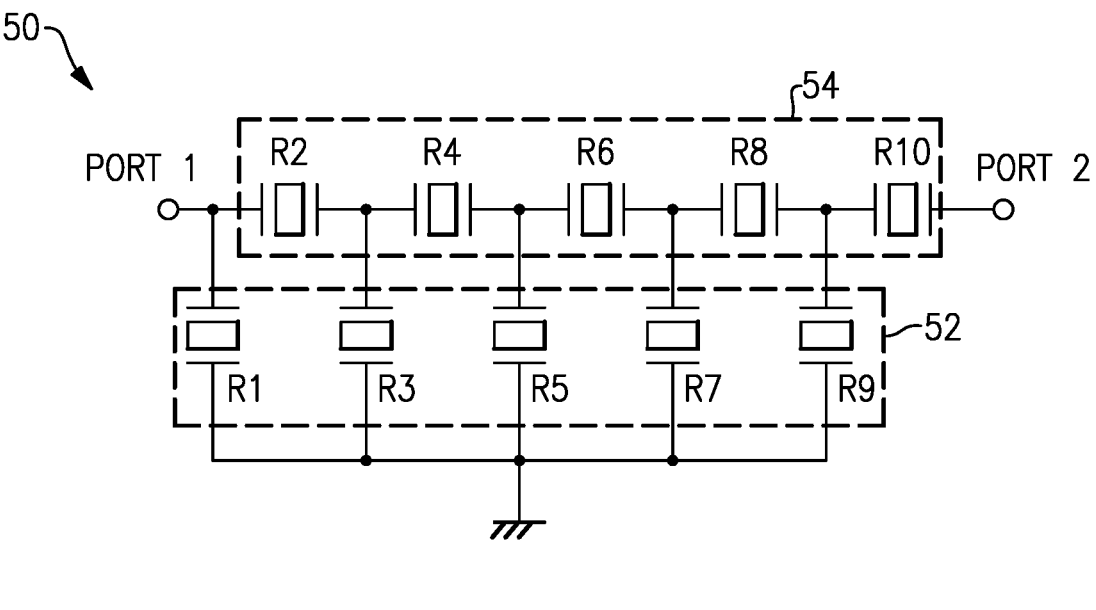
FIG. 5 is a schematic diagram of a ladder filter according to an embodiment.
FIG. 6 is a schematic diagram of a ladder filter according to another embodiment.

FIG. 5 is a schematic diagram of a ladder filter 50 according to an embodiment. The ladder filter 50 includes shunt BAW resonators 52 and series TCSAW resonators 54 coupled between RF input/output ports PORT1 and PORT2. The ladder filter 50 is an example topology of a band pass filter formed from acoustic wave resonators. In a band pass filter with a ladder filter topology, the shunt resonators can have lower resonant frequencies than the series resonators. The ladder filter 50 can be arranged to filter an RF signal. As illustrated, the shunt BAW resonators include resonators R1, R3, R5, R7, and R9. The illustrated series TCSAW resonators 54 include resonators R2, R4, R6, R8, and R10. In particular, the TCSAW resonators 54 may be formed with features of the embodiments of FIG. 4A and/or FIG. 4B as described herein. The first RF input/output port PORT1 can be a transmit port for a transmit filter or a receive port for a receive filter. The second RF input/output port PORT2 can be an antenna port. Any suitable number of series acoustic resonators can be in included in a ladder filter. Any suitable number of shunt acoustic wave resonators can be included in a ladder filter.

FIG. 6 is a schematic diagram of a ladder filter 60 according to another embodiment. The ladder filter 60 includes a plurality of acoustic resonators R1, R2, . . . , RN−1, and RN arranged between a first input/output port PORT1 and a second input/output port PORT2. One of the input/output ports PORT1 or PORT2 can be an antenna port. In certain instances, the other of the input/output ports PORT1 or PORT2 can be a receive port. In some other instances, the other of the input/output ports PORT1 or PORT2 can be a transmit port.

The ladder filter 60 illustrates that any suitable number of ladder stages can be implemented in a ladder filter in accordance with any suitable principles and advantages disclosed herein. Ladder stages can start with a series resonator or a shunt resonator from any input/output port of the ladder filter 60 as suitable. As illustrated, the first ladder stage from the input/output port PORT1 begins with a shunt resonator R1. As also illustrated, the first ladder stage from the input/output port PORT2 begins with a series resonator RN.

The ladder filter 60 includes shunt resonators R1 and RN−1 and series resonator R2 and RN. The series resonators of the ladder filter 60 including resonators R2 and RN can be acoustic resonators of a first type that have higher Q factors than series resonators of a second type in a frequency range below fs. The shunt resonators of the ladder filter 60 including resonators R1 and RN−1 can be acoustic resonators of the second type and have higher Q factors than shunt resonators of the first type in a frequency range between fs and fp. This can lead to a reduced insertion loss. The ladder filter 60 can be a band pass filter with series resonators of the first type and shunt resonators of the second type. In some other embodiments, the series resonators of the ladder filter 60 including resonators R2 and RN can be acoustic wave resonators of the second type and the shunt resonators of the ladder filter 60 including resonators R1 and RN−1 can be acoustic wave resonators of the first type. In such embodiments, the ladder filter 60 can be a band pass filter.

The resonators of the first type can be TCSAW resonators and the resonators of the second type can be BAW resonators. Accordingly, the ladder filter 60 can include series TCSAW resonators and shunt BAW resonators in certain embodiments. The BAW resonators can include FBARs and/or solidly mounted resonators (SMRs). In particular, the TCSAW resonators of the ladder filter 60 may be formed with features of the embodiments of FIG. 4A and/or FIG. 4B as described herein.

The resonators of the first type can be multi-layer piezo-electric substrate (MPS) SAW resonators and the resonators of the second type can be BAW resonators. Accordingly, the ladder filter 60 can include series MPS SAW resonators and shunt BAW resonators. The BAW resonators can include FBARs and/or SMRs in certain embodiments.

The resonators of the first type can be non-temperature compensated SAW resonators and the resonators of the second type can be BAW resonators. Accordingly, the ladder filter 60 can include series non-temperature compensated SAW resonators and shunt BAW resonators in certain embodiments. The BAW resonators can include FBARs and/or SMRs.

In a band pass filter with a ladder filter topology, such as the acoustic wave filter 60, the shunt resonators can have lower resonant frequencies than the series resonators. In certain embodiments, the shunt resonators of the acoustic wave filter 60 are BAW resonators and the series resonators of the acoustic wave filter 60 are TCSAW resonators. In such embodiments, the acoustic wave filter 60 can be a band pass filter. Such a band pass filter can achieve low insertion loss at both a lower band edge and an upper band edge of a passband.

In a band stop filter with a ladder filter topology, such as acoustic wave filter 60, the shunt resonators can have higher resonant frequencies than the series resonators. In certain embodiments, the acoustic wave filter 60 is a band stop filter, the shunt resonators of the acoustic wave filter 60 are TCSAW resonators, and the series resonators of the acoustic wave filter 60 are BAW resonators. Such a band stop filter can achieve desirable characteristics in a stop band of the band stop filter.

In some embodiments of an acoustic wave filter that includes TCSAW series resonators and BAW shunt resonators, such as a transmit filter with a relatively high power handling specification, one or more series resonators close to a transmit port (or the lower frequency series resonators) can be BAW resonators to help with ruggedness.

In certain embodiments, the ladder filter 60 can be included in a multiplexer in which relatively high γ for the ladder filter 60 in one or more higher frequency carrier aggregation bands is desired. In such applications, an acoustic filter can include shunt resonators of the first type and an acoustic resonator of the second type can be included as a series resonator by which other series resonators of the first type are coupled to a common port of the multiplexer. This can increase γ of the ladder filter 60 in the one or more higher frequency carrier aggregation bands. For example, in applications where the second input/output port PORT2 is a common port of a multiplexer, the series resonator RN can be a BAW resonator, other series resonators of the ladder filter 60 can be TCSAW resonators, and the shunt resonators R1 and RN−1 can be BAW resonators. By having the series resonator RN closest to the common node be a BAW resonator instead of a TCSAW resonator, γ can be increased for the ladder filter 60 in one or more higher frequency carrier aggregation bands.

In some embodiments, the ladder filter 60 can be a transmit filter. In such embodiments an acoustic resonator of the second type can be included as a series resonator by which other series resonators of the first type are coupled to a transmit port of the transmit filter. For example, in applications where the second input/output port PORT2 is a transmit port of a transmit filter, the series resonator RN can be a BAW resonator, other series resonators of the ladder filter 60 can be TCSAW resonators, and the shunt resonators R1 and RN−1 can be BAW resonators.

In certain embodiments, the ladder filter 60 can include more than two types of acoustic resonators. In such embodiments, the majority of the series resonators can be acoustic resonators of the first type (e.g., TCSAW resonators) and the majority of shunt resonators can be resonators of the second type (e.g., BAW resonators). The ladder filter 60 can include a third type of resonator as a shunt resonator and/or as a series resonator in such embodiments. The third type of resonator can be a Lamb wave resonator, for example. The acoustic wave filter 60 can include a plurality series resonators including temperature compensated surface acoustic wave resonators and a plurality of shunt resonators including a Lamb wave resonator. The acoustic wave filter 60 can include a plurality of series resonators including a Lamb wave resonator and a plurality of shunt resonators including bulk acoustic wave resonators.

FIG. 7 is a schematic diagram of a lattice filter 70. The lattice filter 70 is an example topology of a band pass filter formed from acoustic wave resonators. The lattice filter 70 can be arranged to filter an RF signal. As illustrated, the lattice filter 70 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 70 has a balanced input and a balanced output. The lattice filter 70 can be implemented with different type of acoustic resonators in accordance with any suitable principles and advantages disclosed herein. For example, the series resonators RL1 and RL2 can be TCSAW resonators and the shunt resonators RL3 and RL4 can be BAW resonators for a band pass filter. In particular, the TCSAW resonators may be formed with features of the embodiments of FIG. 4A and/or FIG. 4B as described herein.

FIG. 8 is a schematic diagram of a hybrid ladder and lattice filter 80. The illustrated hybrid ladder and lattice filter includes series acoustic wave resonators RL1, RL2, RH3, and RH4 and shunt acoustic wave resonators RL3, RL4, RH1, and RH2. The hybrid ladder and lattice filter 80 can be implemented with different types of acoustic resonators in accordance with any suitable principles and advantages disclosed herein. For example, the series resonators RL1, RL2, RH3, and RH4 can be TCSAW resonators and the shunt resonators RL3, RL4, RH1, and RH2 can be BAW resonators for a band pass filter. In particular, the TCSAW resonators may be formed with features of the embodiments of FIG. 4A and/or FIG. 4B as described herein.

FIG. 9 is a schematic diagram of an acoustic wave filter 91 that includes ladder stages and a multi-mode surface acoustic wave filter 92. The illustrated acoustic wave filter 91 includes series resonators R2 and R4, shunt resonators R1 and R3, and multi-mode surface acoustic wave filter 92. The filter 91 can be a receive filter. The multi-mode surface acoustic wave filter 92 can be connected to a receive port. The multi-mode surface acoustic wave filter 92 includes longitudinally coupled IDT electrodes. The multi-mode surface acoustic wave filter 92 can include a temperature compensation layer over longitudinally coupled IDT electrodes in certain embodiments. The series resonators R2 and R4 can be TCSAW resonators and the shunt resonators R1 and R3 can be BAW resonators for a band pass filter. The shunt resonators R1 and R3 being BAW resonators can help with lower skirt steepness and insertion loss. In particular, the TCSAW resonators may be formed with features of the embodiments of FIG. 4A and/or FIG. 4B as described herein.

Acoustic wave filters disclosed herein include more than one type of acoustic wave resonator. Such filters can be implemented on a plurality of acoustic wave filter die. The plurality of acoustic wave filter die can be stacked and co-packaged with each other in certain embodiments.

Figure 10A:
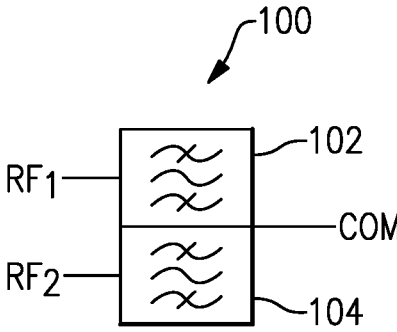
FIG. 10A is a schematic diagram of a duplexer that includes an acoustic wave filter according to an embodiment.

FIG. 10A is a schematic diagram of a duplexer 100 that includes an acoustic wave filter according to an embodiment. The duplexer 100 includes a first filter 102 and a second filter 104 coupled to together at a common node COM. One of the filters of the duplexer 100 can be a transmit filter and the other of the filters of the duplexer 100 can be a receive filter. The transmit filter and/or the receive filter can be respective ladder filters with acoustic wave resonators having a topology similar to the ladder filter 50 of FIG. 5 and the ladder filter 60 of FIG. 6. In some other instances, such as in a diversity receive application, the duplexer 100 can include two receive filters. The common node COM can be an antenna node.

The first filter 102 is an acoustic wave filter arranged to filter a radio frequency signal. The first filter 102 can include acoustic wave resonators coupled between a first radio frequency node $RF_1$ and the common node. The first radio frequency node $RF_1$ can be a transmit node or a receive node. The first filter 102 includes two types of acoustic wave resonators in accordance with any suitable principles and advantages disclosed herein.

The second filter 104 can be any suitable filter arranged to filter a second radio frequency signal. The second filter 104 can be, for example, an acoustic wave filter, an acoustic wave filter that includes two types of acoustic resonators, an LC filter, a hybrid acoustic wave LC filter, or the like. The second filter 104 is coupled between a second radio frequency node $RF_2$ and the common node. The second radio frequency node $RF_2$ can be a transmit node or a receive node.

Although example embodiments may be discussed with filters or duplexers for illustrative purposes, any suitable the principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include an acoustic wave filter including two types of acoustic resonators in accordance with any suitable principles and advantages disclosed herein.

Figure 10B:
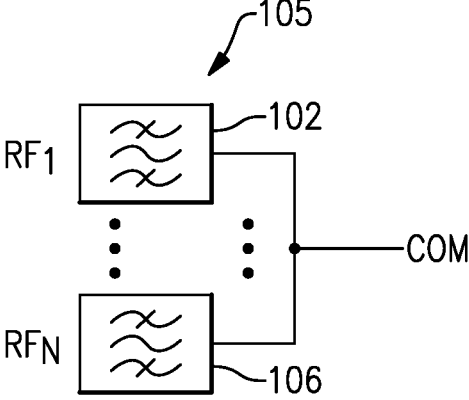
FIG. 10B is a schematic diagram of a multiplexer that includes an acoustic wave filter according to an embodiment.

FIG. 10B is a schematic diagram of a multiplexer 105 that includes an acoustic wave filter according to an embodiment. The multiplexer 105 includes a plurality of filters 102 to 106 coupled together at a common node COM. The plurality of filters can include any suitable number of filters including, for example, 3 filters, 4 filters, 5 filters, 6 filters, 7 filters, 8 filters, or more filters. Some or all of the plurality of the filters can be acoustic wave filters.

The first filter 102 is an acoustic wave filter arranged to filter a radio frequency signal. The first filter 102 can include acoustic wave resonators coupled between a first radio frequency node $RF_1$ and the common node. The first radio frequency node $RF_1$ can be a transmit node or a receive node. The first filter 102 includes two types of acoustic resonators in accordance with any suitable principles and advantages disclosed herein. The other filter(s) of the multiplexer 105 can include one or more acoustic wave filters, one or more acoustic wave filters that include two types of acoustic resonators in accordance with any suitable principles and advantages disclosed herein, one or more LC filters, one or more hybrid acoustic wave LC filters, or any suitable combination thereof.

The acoustic wave filters disclosed herein can be implemented in a variety of packaged modules. In particular, acoustic wave filters disclosed herein may be formed with features of the embodiments of FIG. 4A and/or FIG. 4B as described herein. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on the same packaging substrate. The packaging substrate can be a laminate substrate, for example. FIGS. 11 to 15 are schematic block diagrams of illustrative packaged modules according to certain embodiments. Any suitable combination of features of these packaged modules can be implemented with each other. While duplexers are illustrated in the example packaged modules of FIGS. 12, 13, and 15, any other suitable multiplexer that includes a plurality of filters coupled to a common node and/or standalone filter can be implemented instead of one or more duplexers. For example, a triplexer can be implemented in certain embodiments. As another example, one or more filters of a packaged module can be arranged as a transmit filter or a receive filter that is not included in a multiplexer.

FIG. 11 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include one or more acoustic wave filters in accordance with any suitable combination of features of the acoustic wave filters disclosed herein. The acoustic wave component 202 can include an acoustic wave filter with series TCSAW resonators and shunt BAW resonators, for example.

The acoustic wave component 202 shown in FIG. 11 includes one or more acoustic wave filters 204 and terminals 205A and 205B. The one or more acoustic wave filters 204 includes an acoustic wave filter implemented in accordance with any suitable principles and advantages disclosed herein. The terminals 205A and 204B can serve, for example, as an input contact and an output contact. Although two terminals are illustrated, any suitable number of terminals can be implemented for a particular implementation. The acoustic wave component 202 and the other circuitry 203 are on the same packaging substrate 206 in FIG. 11. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 203 can be electrically connected to the one or more acoustic wave filters 204. The radio frequency module 200 can include one or more packaging structures to, for example, provide protection and/or facilitate easier handling of the radio frequency module 200. Such a packaging structure can include an overmold structure formed over the packaging substrate 206. The overmold structure can encapsulate some or all of the components of the radio frequency module 200.

FIG. 12 is a schematic block diagram of a module 210 that includes duplexers 211A to 211N and an antenna switch 212. One or more filters of the duplexers 211A to 211N can include an acoustic wave filter in accordance with any suitable principles and advantages disclosed herein. Any suitable number of duplexers 211A to 211N can be implemented. The antenna switch 212 can have a number of throws corresponding to the number of duplexers 211A to 211N. The antenna switch 212 can include one or more additional throws coupled to one or more filters external to the module 210 and/or coupled to other circuitry. The antenna switch 212 can electrically couple a selected duplexer to an antenna port of the module 210.

FIG. 13 is a schematic block diagram of a module 220 that includes a power amplifier 222, a radio frequency switch 224, and duplexers 211A to 211N according to an embodiment. The power amplifier 222 can amplify a radio frequency signal. The radio frequency switch 224 can be a multi-throw radio frequency switch. The radio frequency switch 224 can electrically couple an output of the power amplifier 222 to a selected transmit filter of the duplexers 211A to 211N. One or more filters of the duplexers 211A to 211N can be an acoustic wave filter in accordance with any suitable principles and advantages disclosed herein. Any suitable number of duplexers 211A to 211N can be implemented.

FIG. 14 is a schematic block diagram of a module 230 that includes filters 232A to 232N, a radio frequency switch 234, and a low noise amplifier 236 according to an embodiment. One or more filters of the filters 232A to 232N can include any suitable number of acoustic wave filters in accordance with any suitable principles and advantages disclosed herein. Any suitable number of filters 232A to 232N can be implemented. The illustrated filters 232A to 232N are receive filters. In some embodiments (not illustrated), one or more of the filters 232A to 232N can be included in a multiplexer that also includes a transmit filter. The radio frequency switch 234 can be a multi-throw radio frequency switch. The radio frequency switch 234 can electrically couple an output of a selected filter of filters 232A to 232N to the low noise amplifier 236. In some embodiments (not illustrated), a plurality of low noise amplifiers can be implemented. The module 230 can include diversity receive features in certain embodiments.

FIG. 15 is a schematic diagram of a radio frequency module 240 that includes an acoustic wave filter according to an embodiment. As illustrated, the radio frequency module 240 includes duplexers 211A to 211N, a power amplifier 222, a select switch 224, and an antenna switch 212. The radio frequency module 240 can include a package that encloses the illustrated elements. The illustrated elements can be disposed on the same packaging substrate 247. The packaging substrate 247 can be a laminate substrate, for example. A radio frequency module that includes a power amplifier can be referred to as a power amplifier module. A radio frequency module can include a subset of the elements illustrated in FIG. 15 and/or additional elements. The radio frequency module 240 may include any one of the acoustic wave filters in accordance with any suitable principles and advantages disclosed herein.

The duplexers 211A to 211N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave filter in accordance with any suitable principles and advantages disclosed herein. Similarly, one or more of the receive filters can include an acoustic wave filter in accordance with any suitable principles and advantages disclosed herein. Although FIG. 15 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 222 can amplify a radio frequency signal. The illustrated switch 224 is a multi-throw radio frequency switch. The switch 224 can electrically couple an output of the power amplifier 222 to a selected transmit filter of the transmit filters of the duplexers 211A to 211N. In some instances, the switch 224 can electrically connect the output of the power amplifier 222 to more than one of the transmit filters. The antenna switch 212 can selectively couple a signal from one or more of the duplexers 211A to 211N to an antenna port ANT. The duplexers 211A to 211N can be associated with different frequency bands and/or different modes of operation (e.g., different power modes, different signaling modes, etc.).

Figure 16A:
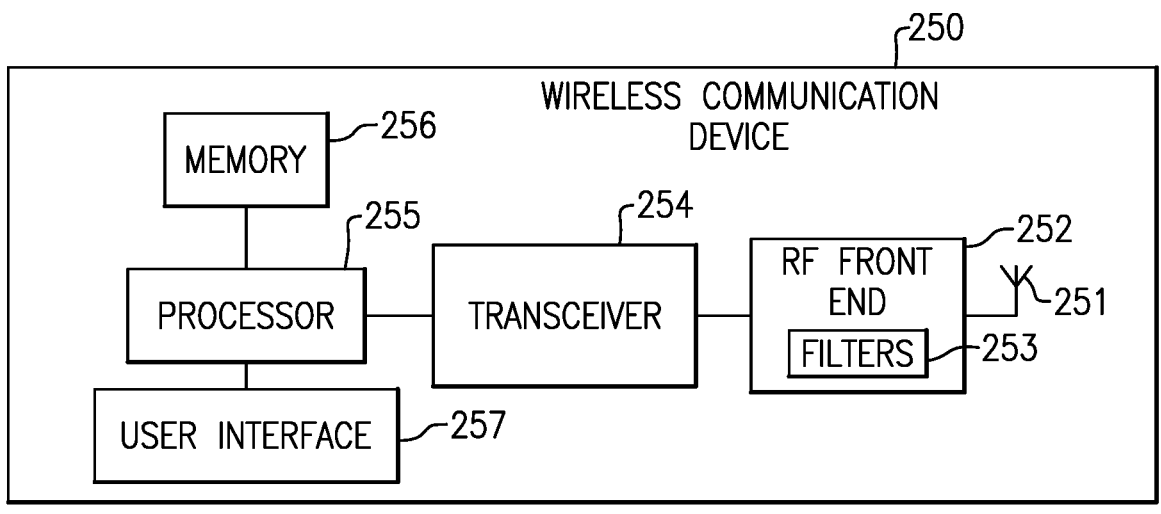
FIG. 16A is a schematic block diagram of a wireless communication device that includes an acoustic wave filter according to an embodiment.

The acoustic wave filters disclosed herein can be implemented in a variety of wireless communication devices. FIG. 16A is a schematic diagram of a wireless communication 250 device that includes filters 253 in a radio frequency front end 252 according to an embodiment. One or more of the filters 253 can be acoustic wave filter in accordance with any suitable principles and advantages disclosed herein. The wireless communication device 250 can be any suitable wireless communication device. For instance, a wireless communication device 250 can be a mobile phone, such as a smart phone. As illustrated, the wireless communication device 250 includes an antenna 251, an RF front end 252, a transceiver 254, a processor 255, a memory 256, and a user interface 257. The antenna 251 can transmit RF signals provided by the RF front end 252. Such RF signals can include carrier aggregation signals. The antenna 251 can receive RF signals and provide the received RF signals to the RF front end 252 for processing. Such RF signals can include carrier aggregation signals. The wireless communication device 250 can include two or more antennas in certain instances.

The RF front end 252 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 252 can transmit and receive RF signals associated with any suitable communication standards. One or more of the filters 253 can include an acoustic wave filter with two types of acoustic resonators that includes any suitable combination of features of the embodiments disclosed above.

The transceiver 254 can provide RF signals to the RF front end 252 for amplification and/or other processing. The transceiver 254 can also process an RF signal provided by a low noise amplifier of the RF front end 252. The transceiver 254 is in communication with the processor 255. The processor 255 can be a baseband processor. The processor 255 can provide any suitable base band processing functions for the wireless communication device 250. The memory 256 can be accessed by the processor 255. The memory 256 can store any suitable data for the wireless communication device 250. The user interface 257 can be any suitable user interface, such as a display with touch screen capabilities.

Figure 16B:
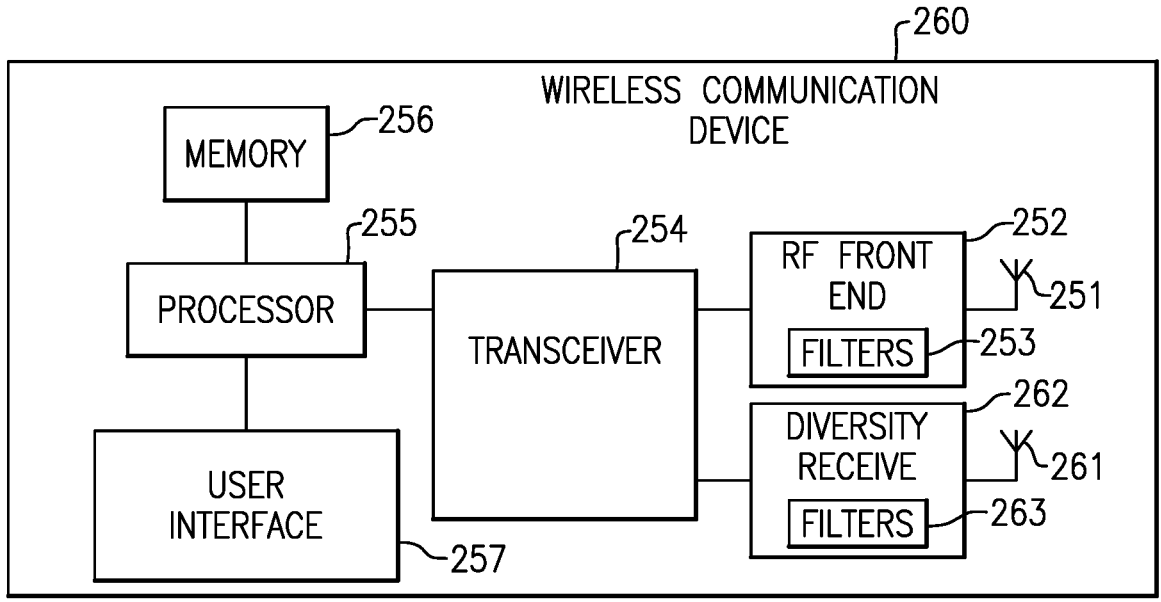
FIG. 16B is a schematic block diagram of another wireless communication device that includes an acoustic wave filter according to an embodiment.

FIG. 16B is a schematic diagram of a wireless communication device 260 that includes filters 253 in a radio frequency front end 252 and second filters 263 in a diversity receive module 262. The wireless communication device 260 is like the wireless communication device 250 of FIG. 16A, except that the wireless communication device 260 also includes diversity receive features. As illustrated in FIG. 16B, the wireless communication device 260 includes a diversity antenna 261, a diversity module 262 configured to process signals received by the diversity antenna 261 and including filters 263, and a transceiver 254 in communication with both the radio frequency front end 252 and the diversity receive module 262. One or more of the second filters 263 can include an acoustic wave filter in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

An acoustic wave filter including any suitable combination of features disclosed herein be arranged to filter a radio frequency signal in a 5G NR operating band within Frequency Range 1 (FR1). A filter arranged to filter a radio frequency signal in a 5G NR operating band can include two types of acoustic resonators in accordance with any principles and advantages disclosed herein. FR1 can be from 410 MHz to 7.125 GHz, for example, as specified in a current 5G NR specification. In 5G implementation, an acoustic wave filter with a relatively wide pass band and relatively low insertion loss can be advantageous for implementing dual connectivity. An acoustic wave filter in accordance with any suitable principles and advantages disclosed herein can be arranged to filter a radio frequency signal in a 4G LTE operating band and/or in a filter having a passband that includes a 4G LTE operating band and a 5G NR operating band. Filters disclosed herein can filter radio frequency signals in a frequency range from about 400 MHz to 3 GHz in certain embodiments.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled," as generally used herein, refers to two or more elements that may be either directly coupled, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this disclosure, shall refer to this application as a whole and not to any particular portions of this disclosure. Where the context permits, words in the above Detailed Description using the singular or plural number may also include the plural or singular number respectively.

While certain embodiments have been described, these embodiments have been presented by way of example only and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A surface acoustic wave (SAW) filter package comprising:
   a piezoelectric substrate;
   a plurality of trenches formed in the piezoelectric substrate, different trenches of the plurality of trenches having different heights;
   a SAW filter disposed in each of the plurality of trenches; and
   a cavity forming layer extending horizontally across the piezoelectric substrate and each of the plurality of trenches.

2. The SAW filter package of claim 1 further comprising a resin layer extending horizontally across the piezoelectric substrate and each of the plurality of trenches.

3. The SAW filter package of claim 2 wherein the resin layer extends directly above the cavity forming layer.

4. The SAW filter package of claim 1 wherein each SAW filter disposed in each of the plurality of trenches comprises a temperature compensation layer.

5. The SAW filter package of claim 1 wherein a trench of the plurality of trenches has a width of between 40 microns and 200 microns.

6. The SAW filter package of claim 1 wherein a trench of the plurality of trenches has a height of between 3.5 microns and 5 microns.

7. A method of forming a surface acoustic wave (SAW) filter package comprising:

forming a plurality of trenches in a piezoelectric substrate, different trenches of the plurality of trenches having different heights;

forming a SAW filter in each of the plurality of trenches; and forming a cavity forming layer extending horizontally across the piezoelectric substrate and each of the plurality of trenches.

8. The method of claim 7 further comprising forming a resin layer extending horizontally across the piezoelectric substrate and each of the plurality of trenches.

9. The method of claim 8 wherein the resin layer is formed directly above the cavity forming layer.

10. The method of claim 7 wherein forming each of the SAW filters in each of the plurality of trenches comprises forming a temperature compensation layer in each of the SAW filters.

11. The method of claim 7 wherein a trench of the plurality of trenches has a width of between 40 microns and 200 microns.

12. The method of claim 7 wherein a trench of the plurality of trenches has a height of between 3.5 microns and 5 microns.

13. A surface acoustic wave (SAW) filter package comprising:

a piezoelectric substrate having an upper surface;

one or more SAW filters disposed on the upper surface of the piezoelectric substrate; and a cavity defined in a layer of $SiO_2$ disposed above each of the one or more SAW filters, sidewalls of the cavity being formed of $SiO_2$ and having portions that are coplanar with the one or more SAW filters in a plane parallel to the upper surface of the piezoelectric substrate.

14. The SAW filter package of claim 13 further comprising a metal layer extending horizontally across the cavity.

15. The SAW filter package of claim 14 further comprising a resin layer extending horizontally across the metal layer.

16. The SAW filter package of claim 13 wherein at least one SAW filter of the one or more SAW filters comprises a temperature compensation layer.

17. The SAW filter package of claim 13 wherein the cavity has a width of between 40 microns and 200 microns.

18. The SAW filter package of claim 13 wherein the cavity has a height of between 3.5 microns and 5 microns.

* * * * *